(12) United States Patent
Oh

(10) Patent No.: US 6,235,113 B1
(45) Date of Patent: May 22, 2001

(54) APPARATUS AND METHOD FOR DISPENSING A LIQUID ON ELECTRICAL DEVICES

(75) Inventor: Seh Hyuk Oh, Cheonan (KR)

(73) Assignee: Samsung Electronics Co., Ltd., Kyungki-do (KR)

(*) Notice: Subject to any disclaimer, the term of this patent is extended or adjusted under 35 U.S.C. 154(b) by 0 days.

(21) Appl. No.: 09/205,002

(22) Filed: Dec. 2, 1998

(30) Foreign Application Priority Data

Dec. 19, 1997 (KR) .................................................. 97-70555

(51) Int. Cl.⁷ .................................................. B05C 15/04
(52) U.S. Cl. .......................... 118/301; 118/505; 156/247; 156/280; 156/390
(58) Field of Search .................................. 118/301, 505; 427/272, 282; 156/247, 280, 390

(56) References Cited

U.S. PATENT DOCUMENTS

| | | | |
|---|---|---|---|
| 2,056,274 | * 10/1936 | Holdsworth | 264/167 |
| 2,590,557 | * 3/1952 | Melsheimer | 427/79 |
| 3,635,730 | * 1/1972 | Sweitzer | 427/282 |

* cited by examiner

Primary Examiner—Mark A. Osele
(74) Attorney, Agent, or Firm—Skjerven Morrill MacPherson LLP; David W. Heid

(57) ABSTRACT

An apparatus for dispensing a liquid or encapsulating a semiconductor device package on a tape is disclosed. The apparatus comprises: a dispensing station for dispensing a liquid encapsulant on the tape; a tape transfer station; a cover film attaching station for attaching a cover film to the tape to screen windows of the tape; and a cover film detaching station. The cover film is automatically attached to and separated from the tape by the cover film attaching station and the cover film detaching station. The apparatus prevents the liquid from flowing under the tape. In addition, a method for encapsulating a semiconductor device package having a tape is disclosed.

20 Claims, 6 Drawing Sheets

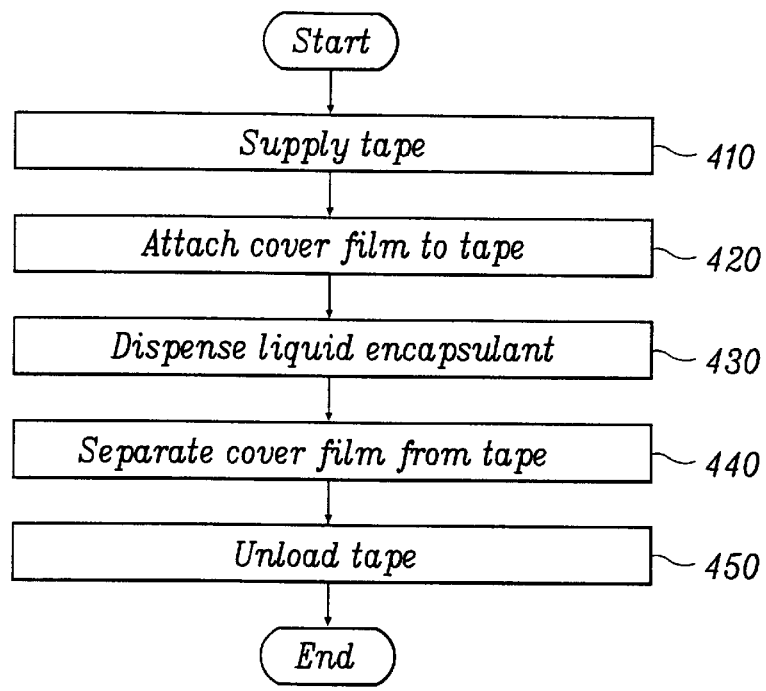
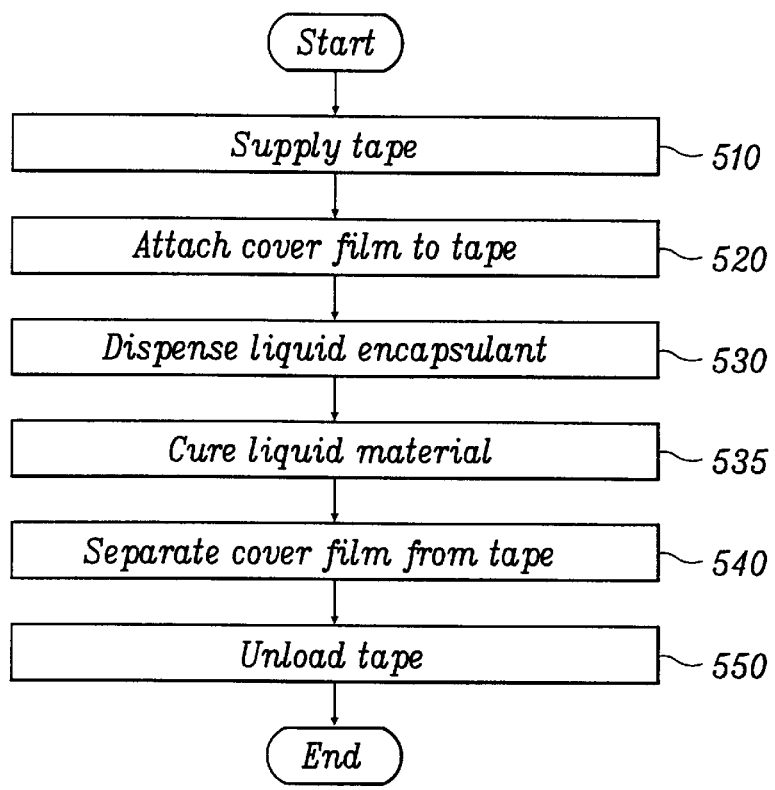

APPARATUS AND METHOD FOR DISPENSING A LIQUID ON ELECTRICAL DEVICES

BACKGROUND OF THE INVENTION

1. Field of the Invention

The present invention relates to an apparatus for manufacturing electrical device packages. More particularly, the invention relates to an apparatus for dispensing a liquid encapsulant to encapsulate a semiconductor chip that is attached to a tape.

2. Description of the Related Art

In a typical process for fabricating a plastic semiconductor package, a semiconductor chip after being attached and wire-boned to a lead frame is encapsulated with a molding compound by transfermolding. However, other packaging process can employ different encapsulation methods. For example, a micro ball grid array ($\mu$BGA) package, which includes a tape instead of a leadframe of the plastic package, is encapsulated by a liquid encapsulant coating process.

The tape typically has windows exposing parts of the beam leads for connection to the semiconductor chip. A fabrication method, which employs the tape with windows, is described below. A typical assembly process for assembling a $\mu$BGA package begins with providing a tape made of, for example, polyimide, and having windows and metal beam leads across the windows. A semiconductor chip is attached to the tape using an adhesive, and the beam leads are connected to bonding pads on the chip through the windows. Then the windows are filled with an encapsulant to protect the chip and the electrical connections.

FIG. 1 is a schematic diagram showing a conventional reel-to-reel dispensing apparatus 100 for filling the windows with an encapsulant. Apparatus 100 includes: a dispensing station 40 for coating a liquid encapsulant on a tape 10 to which a semiconductor chips 11 are attached; a reel-to-reel handling track 60 for moving tape 10 at dispensing station 40; a tape feed station 20 for feeding tape 10; and a tape take-up station 70 for unloading tape 10 from dispensing station 40 after the coating process. The structure of apparatus 100 will be explained based on the order of the movement of tape 10.

A tape feed reel 22 of tape 10 is loaded into tape feed station 20. A protection tape 30 which is wound with tape 10 in reel 22 to protect chips 11 is removed from the reel as tape 10 is supplied to dispensing station 40. When removed, protection tape 30 is wound to a protection tape take-up reel 26, while tape 10 moves to a support plate 50 in dispensing station 40. In dispensing station 40, a syringe 42 above support plate 50 dispenses a liquid encapsulant through a needle 44 to an upper surface 12 (FIG. 2) of tape 10, which includes chips 11. An actuator 46 coupled to syringe 42 controls the movement of syringe 42. Tape 10 is then transferred to tape take-up station 70 which winds tape 10 on a reel 72. At the same time, a protection tape 80 for protecting chips 11 on tape 10 is wound as an interleaf. Reel-to-reel handling track 60 controls the movement of tape 10 from tape feed station 20 to tape take-up station 70.

Dispensing of the liquid encapsulant on the top of tape 10 is further described with reference to FIG. 2. In FIG. 2, chip 11 is attached to tape 10 by an elastomer adhesive 18, and beam leads 16 electrically connect chip 11 to tape 10 at windows 14. For encapsulation, tape 10 is placed on support plate 50. A suction port 52 connected to a vacuum pump (not shown) holds tape 10 to support table 50.

Then, syringe 42 (FIG. 1) dispenses a liquid encapsulant 47 along periphery of chip 11 to protect the electrical connection area between chip 11 and beam leads 16. When dispensed, liquid encapsulant 47 fills windows 14 (47b), covers the periphery of chip 11 (47a), and undesirably runs out through a gap between tape 10 and support table 50 (47c). This may eventually contaminate support plate 50 and adversely affect dispensing encapsulant on following tapes.

To stop the encapsulant from running into the gap, several methods have been proposed. Two representative examples are depicted in FIG. 3 and FIG. 4. FIG. 3 shows a tape 10 covered with a photo solder resist (PSR) film 90, which can be removed by etching after dispensing, and FIG. 4 shows a piece of tape 10 temporarily held on a magazine substrate 94.

With reference to FIG. 3, tape 10 having windows 14 and sprocket holes 19 has PSR film 90 formed on the bottom surface of tape 10 before the encapsulant coating step. PSR film 90 can prevent the liquid encapsulant from running onto support table 50 (FIG. 2). After the encapsulant is cured, etching can remove PSR film 90.

With reference to FIG. 4, tape 10, which is cut to size, is placed on a magazine substrate 94. Magazine substrate 94 has a surrounding lip that prevents the liquid encapsulant from running onto support table 50 (FIG. 2).

However, the method of FIG. 3 requires costly processing steps including forming PSR film 90 on the bottom of tape 10 before the encapsulant coating step, and partly removing PSR film 90 to expose windows 14 and solder ball pads (not shown). The method of FIG. 4 reduces manufacturing efficiency by requiring an addition of tape cutting step, and because a batch-type process using tape strips is less efficient than a reel-to-reel process.

SUMMARY OF THE INVENTION

According to an aspect of the present invention an apparatus for dispensing a liquid encapsulant to encapsulate a semiconductor package includes: a dispensing station for dispensing the liquid encapsulant to a tape; a tape transfer station for transferring the tape to the dispensing station; a cover film attaching station for attaching a cover film to the bottom of the tape before transferring the tape to the dispensing station; and a cover film detaching station for separating the cover film from the tape after dispensing of the liquid encapsulant. The cover film prevents the liquid encapsulant from flowing into a gap between the tape and a stage with which the tape is in contact.

The cover film attaching station includes an attaching means which moves vertically with respect to the cover film. When the cover film is under the tape, the attaching means flattens the cover film and the tape, and uses a press roller to apply pressure to the cover film and attach the cover film to the tape. The cover film detaching station includes a separator which helps the cover film separate from the tape so that an excessive force is not applied to the cover film or the tape.

According to another aspect of the present invention, a method for dispensing a liquid encapsulant on the top of a tape of a semiconductor package employs a removable cover film attached to the tape to prevent leakage of encapsulant.

BRIEF DESCRIPTION OF THE DRAWINGS

These and various other features and advantages of the present invention will be readily understood with reference to the following detailed description taken in conjunction with the accompanying drawings. In the drawings, like reference numerals designate like structural elements, and, in which:

FIG. 10 is a flow chart of one embodiment of the dispensing process according to the present invention; and FIG. 11 is a flow chart of another embodiment of the dispensing process according to the present invention.

DETAILED DESCRIPTION OF THE INVENTION

The present invention is described in detail hereinafter with reference to the accompanying drawings, in which embodiments of the invention are shown. This invention may, however, be embodied in many different forms and should not be construed as limited to the embodiments set forth herein.

Figure 1:
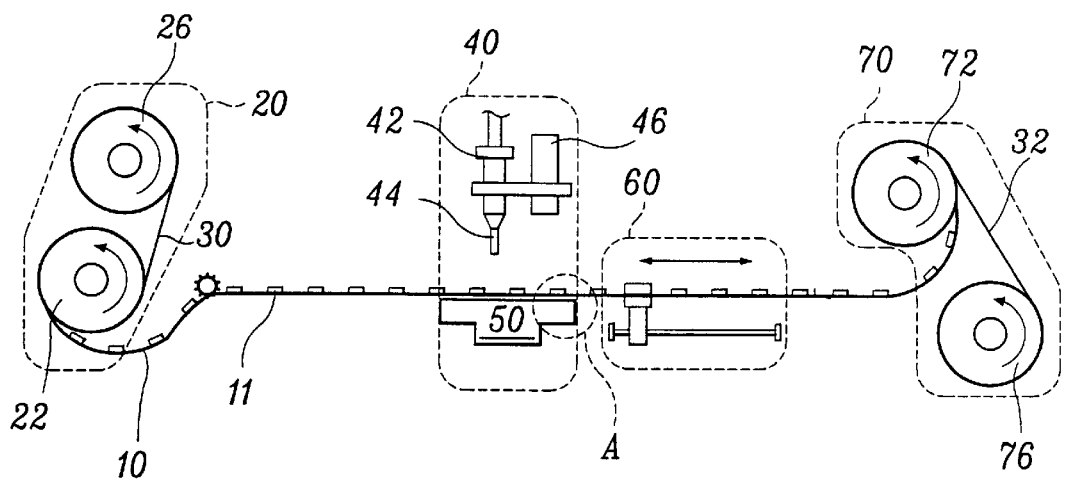
FIG. 1 is a schematic diagram showing a conventional reel-to-reel dispensing apparatus.
Figure 2:
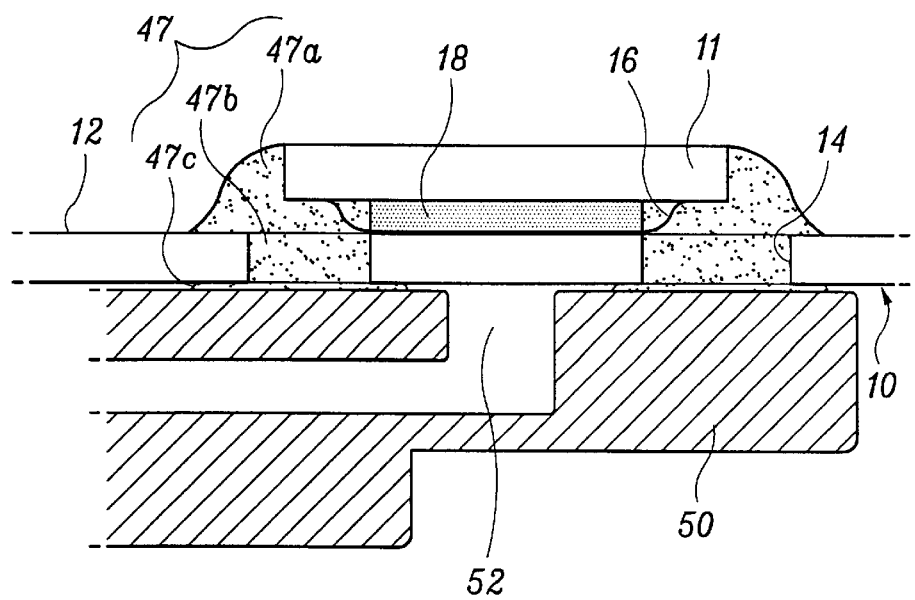
FIG. 2 is an enlarged view of part A in FIG. 1.
Figure 3:
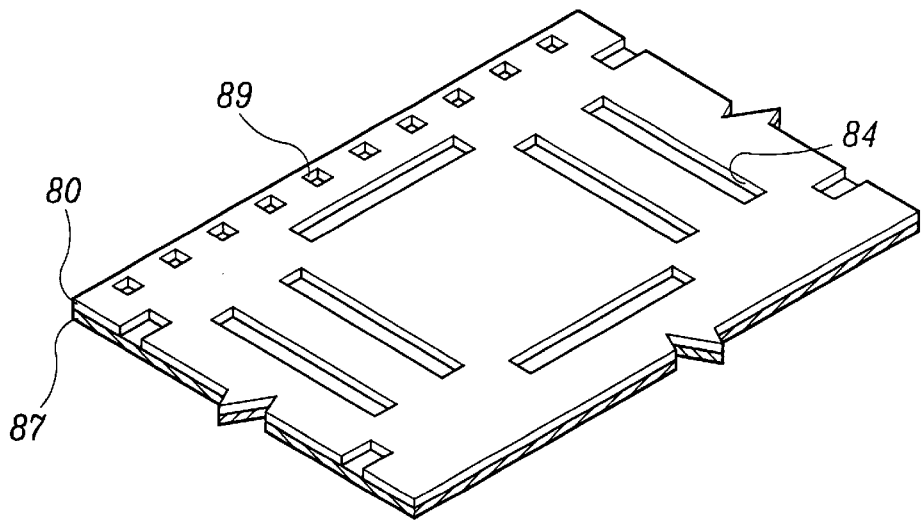
FIG. 3 is a perspective view of a tape with a PSR film formed thereon.
Figure 4:
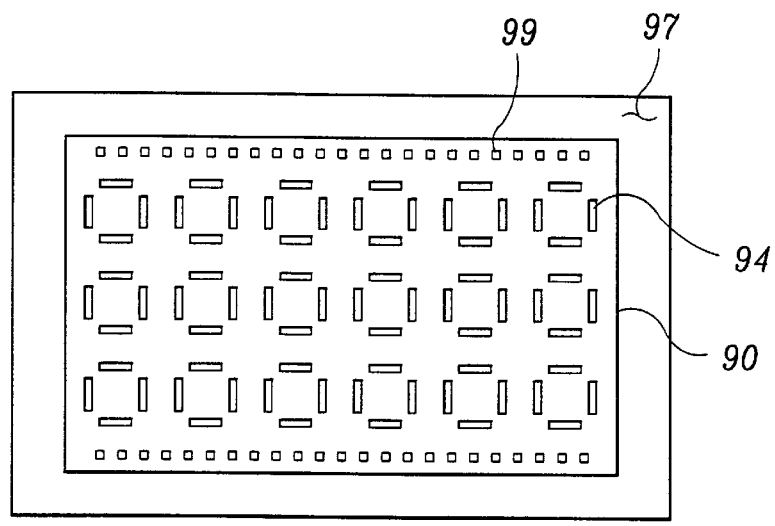
FIG. 4 is a plan view of a conventional tape on a magazine substrate.
Figure 5:
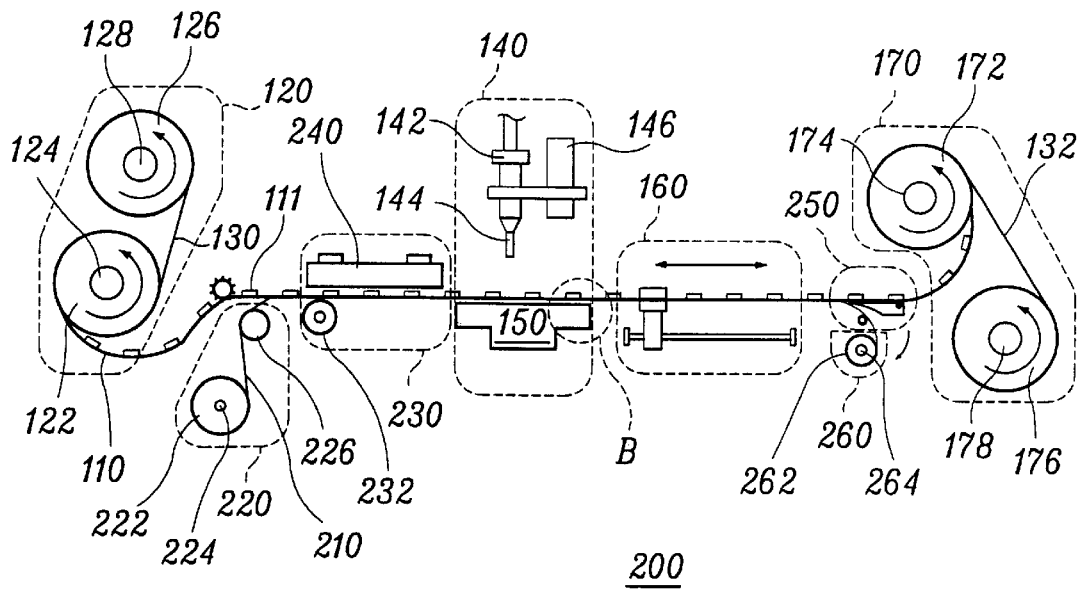
FIG. 5 is a schematic diagram of a dispensing apparatus according to the present invention.

FIG. 5 is a schematic diagram of a dispensing apparatus 200 according to an embodiment of the present invention. Apparatus 200 includes a dispensing station 140, a tape transfer station 160, a tape feed station 120 and a tape unloading station 170. Apparatus 200 further includes a cover film attaching station 230 for attaching a cover film 210 to a tape 110, a cover film feed station 220 for feeding cover film 210 to cover attaching station 230, a cover film detaching station 250, and a cover film unloading station 260.

A tape feed reel 122, in which tape 110 having semiconductor chips 111 and an interleaf protection tape 130 are wound together, is held to an axle 124. When tape 110 feeds out of tape feed reel 122, protection tape 130 from tape feed reel 122 is wound around a protection tape take-up reel 126 which is held to an axle 128. At the same time that tape 110 feeds into cover film attaching station 230, a cover film reel 222 held to an axle 224 feeds cover film 210 to cover film attaching station 230 via a guide roller 226.

An upper attach means 240 and a lower attach means 232 of cover film attaching station 230 bond cover film 210 to tape 110. To promote the bonding, cover film 210 includes an adhesive layer on a surface that is bonded to tape 110. The adhesive layer bonds cover film 210 and tape 110 temporarily, for example, for 20 to 40 minutes, so as to separate cover film 210 and tape 110 easily after encapsulation. A film such as REVALFA made by Nitto Denko Corporation in Japan is suitable for cover film 210. An assembly including tape 110 and cover film 210 moves to dispensing station 140. Dispensing station 140 includes a syringe 142, a motor 146 coupled to syringe 142, and a support plate 150. While the assembly is on support table 150, motor 146 moves syringe 142, and syringe 142 dispenses a liquid encapsulant through a needle 144 to encapsulate chip 111 and tape 110. Motor 146 can freely move a lower end of syringe 142 to position syringe 142 for dispensing liquid at desired locations on tape 110. After passing through dispensing station 140, tape 110 and cover film 210 are separated from each other at cover film detaching station 250. Then tape 110 is wound with a protection film 180 to a reel 172 in tape unloading station 170. At this time, cover film 210 moves to cover film unloading station 260 and is wound to a cover film take-up reel 262.

A tape transfer station 160 controls movement of tape 110 and cover film 210 in apparatus 200 by controlling driving axles 128, 174 and 264 coupled to respective reels 126, 172 and 262. Supporting axles 124, 178 and 224 simply support reels 122, 176, and 222, respectively.

Figure 6:
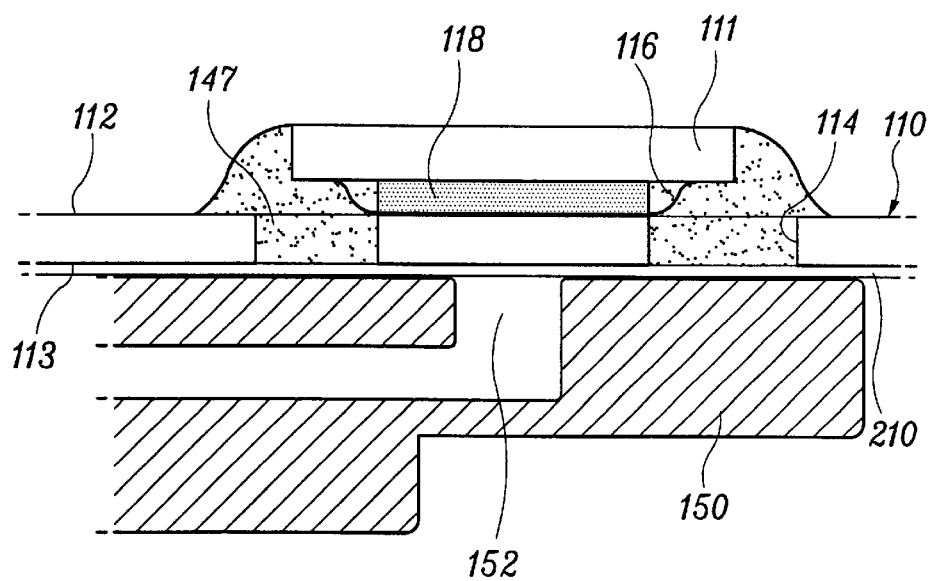
FIG. 6 is an enlarged view of part B of FIG. 5.

A part of tape 110 where the liquid encapsulant is dispensed is described in more detail with reference to FIG. 6 which depicts part 'B' in FIG. 5. Chip 111 is attached on the top surface 112 of tape 110 by an elastomer adhesive 118. Tape 110 includes windows 114 for connecting beam leads 116 to chip 111. When tape 110 is on support plate 150, cover film 210 is on the bottom surface 113 of tape 110 and firmly held to support plate 150 by a suction port 152 connected to a vacuum pump (not shown). Liquid material 147, e.g., an encapsulant, is applied around chip 111 to protect the electrical connections between chip 111 and beam leads 116, and the surface of chip 111 not covered by tape 110. Cover film 210 dams or blocks windows 114 of tape 110 and prevents encapsulant 147 from flowing onto support table 150.

Figure 7A:
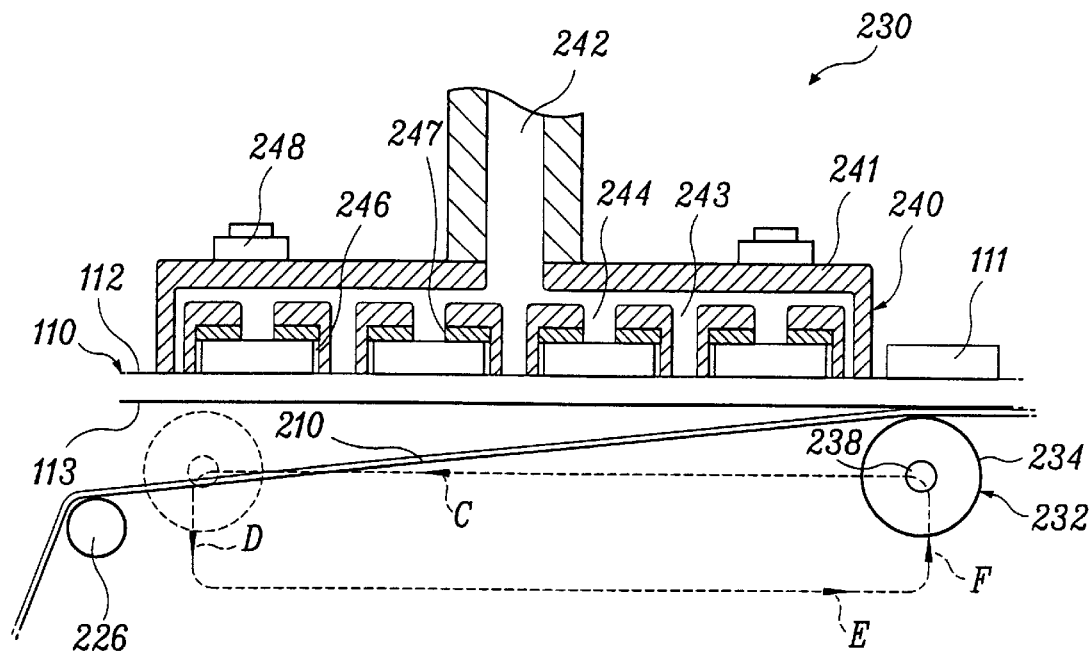
FIG. 7A is a partial longitudinal sectional view of a cover film attaching station in the apparatus of FIG. 5.
Figure 7B:
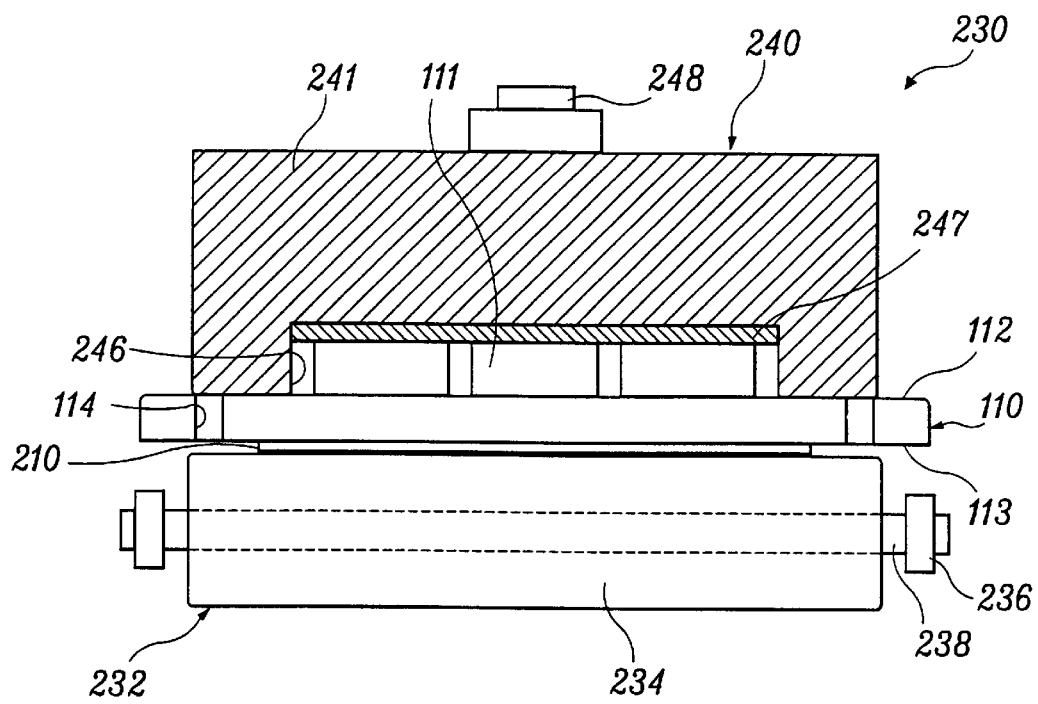
FIG. 7B is a partial traverse sectional view of a cover film attaching station in the apparatus of FIG. 5.

FIGS. 7a and 7b are partial sectional views of cover film attaching station 230 of FIG. 5 in longitudinal and traverse directions of cover film 210, respectively.

Cover film attaching station 230 includes upper attach means 240 and lower attach means 232. With reference to FIG. 7A, upper attach means 240 flattens tape 110. In particular, a suction plate 241 of upper attach means 240 includes a number of suction holes 243 and 244 respectively for holding tape 110 and chips 111, and a number of cavities 246 for receiving chips 111. Each cavity 246 has a protective layer 247 to protect chip 111 on a surface where chip 111 is held by suction hole 244. Suction holes 243 and 244 are in communication with a vent 242 connected to an external vacuum pump, and a plate transfer means 248 attached to plate 241 moves plate 241 up and down.

Referring to FIG. 7B, while upper attach means holds tape 110 flat, a roller 234 of lower attach means 232 rolls under cover film 210 pressing bottom of cover film 210 to bond cover film 210 to tape 110. It is preferable that cover film 210 is narrower than tape 110, and roller 234 and plate 241 are narrower than tape 110 but wider than cover film 210. Roller 234 moves in directions of F-C-D-E of FIG. 7A in that order. When moving upward in direction F, roller 234 presses cover film 210 to tape 110, and then roller 234 moves in direction C rolling and pressing cover film 210 so as to bond cover film 210 to tape 110. Then, roller 234 moves downward in direction D and back to the original position in direction E to prepare for a next bonding. Roller 234 is coupled via a roller transfer means 238 to an external driving means (not shown), and a rotating axis 236 rotates roller 234.

Figure 8:
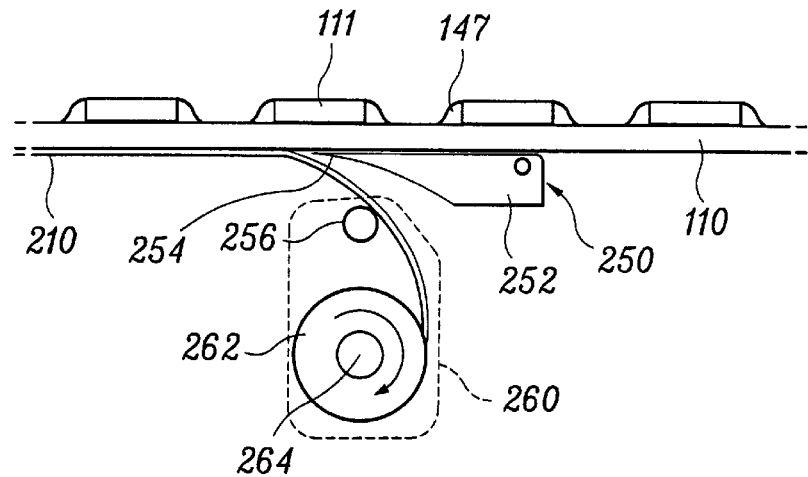
FIG. 8 is a partial sectional view of a cover film detaching station in the apparatus of FIG. 5.

FIG. 8 is a partial sectional view of cover film detaching station 250 in apparatus 200 of FIG. 5. With reference to FIG. 8, cover film detaching station 250 has a guide pin 252, which is positioned so as to separate tape 110 and cover film 210 after the liquid is applied to tape 110. Sharp end 254 of guide pin 252 is placed between cover film 210 and tape 110, and cover film 210 separates from tape 110 as tape 110 moves forward.

Figure 9:
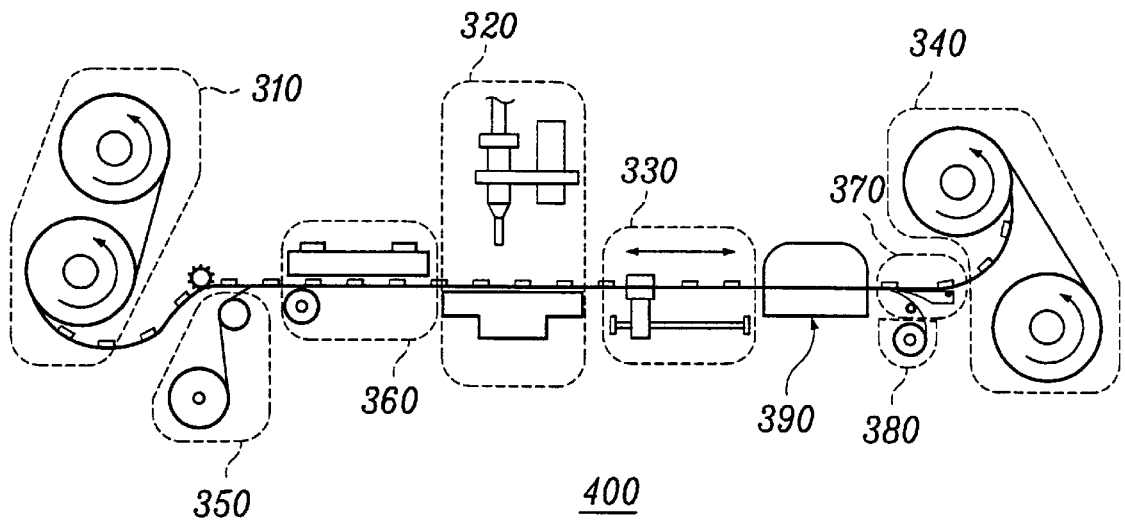
FIG. 9 is a schematic diagram depicting another embodiment of the dispensing apparatus according to the present invention.

FIG. 9 is a schematic diagram of a dispensing apparatus 400 according to another embodiment of the present invention. Like apparatus 200 of FIG. 5, apparatus 400 has a dispensing station 320, a tape transfer station 330, a tape feed station 310, a tape unloading station 340, a cover film feed station 350, a cover film attaching station 360, a cover film detaching station 370 and a cover film unloading station 380. Apparatus 400 further includes a curing station 390 for curing a liquid encapsulant after encapsulation of a chip. Curing station 390 heats the encapsulated chip and tape, and is preferably located between dispensing station 320 and tape unloading station 340.

FIG. 10 is a flow chart of one embodiment of a dispensing process according to the present invention. With reference to FIG. 10, the dispensing process includes supplying a tape (step 410), attaching a cover film to the bottom of the tape (step 420), dispensing a liquid (e.g. a liquid encapsulant) on the top of the tape (step 430), separating the cover film from the bottom of the tape (step 440), and unloading the tape (step 450). The tape includes windows and a semiconductor chip attached to the tape by an adhesive.

FIG. 11 is a flow chart of another embodiment of a dispensing process according to the present invention. With reference to FIG. 11, the dispensing process includes supplying a tape (step 510), attaching a cover film to the bottom of the tape (step 520), dispensing a liquid encapsulant on the top of the tape (step 530), curing the liquid encapsulant (step 535), separating the cover film from the bottom of the tape (step 540), and unloading the tape (step 550).

As described in the hereinbefore, the present invention provides apparatuses and methods for dispensing a liquid and encapsulating semiconductor chips on a tape. Although the present invention has been described with reference to specific embodiments of the invention, the concept thereof can be applied without restriction to other embodiments.

What is claimed is:

1. A liquid dispensing apparatus comprising:
    a dispensing station that dispenses a liquid on a top side of a tape, the tape having a plurality of windows formed therethrough;
    a cover film attaching station that attaches a cover film to a bottom side of the tape before transferring the tape to the dispensing station, the cover film screening the windows so as to prevent the liquid from flowing from under the tape through the windows; and
    a cover film detaching station that separates the cover film from the tape and leaves the liquid in the windows of the tape.

2. The apparatus according to claim 1, wherein the tape comprises beam leads formed on the tape traversing the windows, and the beam leads electrically connect to a semiconductor chip attached to the tape.

3. The apparatus according to claim 1, wherein the liquid is an encapsulant for encapsulating a semiconductor chip.

4. The apparatus according to claim 1, further comprising:
    a cover film feed station for feeding the cover film to the cover film attaching station; and
    a cover film unloading station for taking up the separated cover film from the cover film detaching station,
    wherein the cover film feed station and the cover film unloading station operate in association with the movement of the tape transfer station to feed and unload the cover film automatically.

5. The apparatus according to claim 4, wherein the cover film feed station has a reel from which the cover film is fed, and the cover film unloading station has a reel to which the cover film is wound.

6. The apparatus according to claim 5, wherein the reel in the cover film feed station is coupled to a support axle which supports a free rotation of the reel.

7. The apparatus according to claim 6, wherein the reel in the cover film unloading station is coupled to a driving axle which is coupled to a motor so as to rotate the reel.

8. The apparatus according to claim 1, further comprising a curing station for solidifying the liquid after the dispensing station.

9. A liquid dispensing apparatus comprising:
    a dispensing station that dispenses a liquid on a top side of a tape, the tape having a plurality of windows formed therethrough;
    a cover film attaching station that attaches a cover film to a bottom side of the tape before transferring the tape to the dispensing station, the cover film screening the windows so as to prevent the liquid from flowing from under the tape through the windows, wherein the cover film attaching station has an upper attach means and a lower attach means located respectively above and below the tape and the cover film; and
    a cover film detaching station that separates the cover film from the tape after the liquid is applied to the top side of the tape.

10. The apparatus according to claim 9, wherein the lower attach means comprises a press which presses and bonds the cover film to the tape.

11. The apparatus according to claim 10, wherein the press comprises a roller rolling around a rotating axle.

12. The apparatus according to claim 11, wherein the roller moves in a direction that the roller approaches to the cover film, a direction opposite of a direction of transferring of the tape, a direction that the roller departs away from the cover film, and the direction of the transferring of the tape.

13. The apparatus according to claim 9, wherein the upper attach means comprises a flattening means which flattens the tape.

14. The apparatus according to claim 13, wherein the flattening means is a plate comprising at least one suction hole for vacuum-suctioning the tape.

15. The apparatus according to claim 14, wherein semiconductor chips are attached to the tape.

16. The apparatus according to claim 15, wherein the plate further comprises cavities, each cavity receiving a semiconductor chip.

17. The apparatus according to claim 16, wherein each cavity comprises a protective layer for protecting the semiconductor chip and at least one suction hole for vacuum-suctioning the semiconductor chip.

18. The apparatus according to claim 15, wherein the tape comprises beam leads formed on the tape traversing the windows, and the semiconductor chips electrically connect to the beam leads.

19. A liquid dispensing apparatus comprising:
    a dispensing station that dispenses a liquid on a top side of a tape, the tape having a plurality of windows formed therethrough;
    a cover film attaching station that attaches a cover film to a bottom side of the tape before transferring the tape to the dispensing station, the cover film screening the windows so as to prevent the liquid from flowing from under the tape through the windows; and a cover film detaching station that separates the cover film from the tape after the liquid is applied to the top side of the tape, wherein the cover film detaching station has a guide pin located between the tape and the cover film.

20. The apparatus according to claim 18, wherein the tape comprises beam leads formed on the tape traversing the windows, and the beam leads electrically connect to a semiconductor chip attached to the tape.

* * * * *